(12) United States Patent
Zhou et al.

(10) Patent No.: US 11,978,399 B2
(45) Date of Patent: May 7, 2024

(54) PIXEL DRIVE CIRCUIT, DISPLAY PANEL, AND DISPLAY DEVICE

(71) Applicant: HKC CORPORATION LIMITED, Shenzhen (CN)

(72) Inventors: Xiufeng Zhou, Shenzhen (CN); Xin Yuan, Shenzhen (CN); Rongrong Li, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/069,584

(22) Filed: Dec. 21, 2022

(65) Prior Publication Data

US 2023/0419898 A1    Dec. 28, 2023

(30) Foreign Application Priority Data

Jun. 28, 2022  (CN) .......................... 202210739055.9

(51) Int. Cl.
| | |
|---|---|
| G09G 3/3233 | (2016.01) |
| G09G 3/20 | (2006.01) |
| H01L 27/146 | (2006.01) |
| H01L 29/49 | (2006.01) |
| H10K 50/80 | (2023.01) |

(52) U.S. Cl.
CPC ......... *G09G 3/3233* (2013.01); *G09G 3/2074* (2013.01); *H01L 27/14609* (2013.01); *H01L 29/4908* (2013.01); *H10K 50/80* (2023.02)

(58) Field of Classification Search
CPC ................ G09G 3/3233; G09G 3/2074; H01L 27/14609; H01L 29/4908; H10K 50/80
See application file for complete search history.

(56) References Cited

U.S. PATENT DOCUMENTS

2008/0296689 A1* 12/2008 Wang ................... H10K 10/482
257/365
2016/0189606 A1*  6/2016 Chen ................... G09G 3/3233
345/78

(Continued)

FOREIGN PATENT DOCUMENTS

| CN | 110010688 A | 7/2019 |
|---|---|---|
| CN | 112259050 A | 1/2021 |

(Continued)

*Primary Examiner* — Patrick N Edouard
*Assistant Examiner* — Joseph P Fox
(74) *Attorney, Agent, or Firm* — Maier & Maier, PLLC

(57) ABSTRACT

A pixel drive circuit, a display panel and a display device. In the pixel drive circuit, a voltage-stabilization transistor is arranged, and the voltage-stabilization transistor is provided with two control ends, each of the two control ends forms a voltage-stabilization capacitor with the active layer, thereby a new capacitor is added on the basis of the original parasitic capacitor. The new capacitor has a relatively large capacitance value. The potential variation at the control end of the drive transistor depends on the parasitic capacitor of the drive transistor, the storage capacitor at the control end of the drive transistor, and the capacitance value of the new capacitor, when the capacitive coupling effect occurs, the voltage at the control end of the drive transistor can be jointly maintained by the above three capacitors, thereby improving the effect of voltage stabilization.

13 Claims, 5 Drawing Sheets

(56) References Cited

U.S. PATENT DOCUMENTS

2016/0232849 A1* 8/2016 Jeon .................... G09G 3/3233
2021/0327983 A1   10/2021 Kim et al.

FOREIGN PATENT DOCUMENTS

| CN | 112397029 A | 2/2021 |
| CN | 113257192 A | 8/2021 |
| CN | 113937157 A | 1/2022 |
| CN | 114067720 A | 2/2022 |
| CN | 114220382 A | 3/2022 |

* cited by examiner

PIXEL DRIVE CIRCUIT, DISPLAY PANEL, AND DISPLAY DEVICE

CROSS-REFERENCE TO RELATED APPLICATION

Pursuant to 35 U.S.C. § 119 and the Paris Convention, this application claims the benefit of Chinese Patent Application No. 202210739055.9 filed on Jun. 28, 2022, the content of which is incorporated herein by reference.

FIELD

The present application relates to the field of display technology, and in particular, to a pixel drive circuit, a display panel and a display device.

BACKGROUND

The statements provided herein are merely background information related to the present application, and do not necessarily constitute any prior arts. The organic light-emitting diode (OLED) pixel circuit refers to a driving mode that each OLED pixel is equipped with a thin film transistor (TFT) and a capacitor layer, when a certain row and a certain column are powered on to activate the intersecting pixel corresponding to the certain row and column, the capacitor layer in this pixel can be maintained at a charge state between refreshes, thereby achieving a faster and more precise control on the pixel light emission.

Due to the influence of manufacturing process, the threshold voltage of the thin film transistor in different pixels are different. Even if the data voltages Vdata having the same value are provided to different thin film transistors, the current generated will still be different, which also results in uneven brightness of the panel. In addition, if a pixel-compensation circuit is adopted to compensate the above voltage, most compensation circuits will be limited by the short scanning time, which affects the compensation effect. At present, the mostly-used method to compensate a pixel driver is using an internal compensation circuit. However, in the current compensation method of the pixel driver, a capacitive coupling effect will occur when a writing control transistor is switched off. That is, when a potential jump occurs at the control end of the drive transistor, the magnitude of the potential jump depends on the parasitic capacitor of the writing control transistor and the storage capacitor at the control end of the drive transistor. Due to the demand for pixel functionality, the capacitive coupling effect in this circuit structure is unavoidable, and also due to the non-uniformity of the manufacturing process, the coupling effect of different pixels are different, resulting in a difference in the potential at the control end of the drive transistor after the capacitive coupling is completed, which eventually leads to the difference in brightness of pixel light emission, so there are many shortcomings.

SUMMARY

The present application provides a pixel drive circuit, a display panel and a display device, aiming to overcome the above shortcomings in compensation caused due to the capacitive coupling effect of the internal compensation circuit in the current driving circuit.

In accordance with a first aspect of the embodiments of the present application, a pixel drive circuit is provided, which is applied to a display panel. The display panel includes a plurality of pixels, each pixel includes a plurality of sub-pixel elements. The pixel drive circuit includes a drive-compensation circuitry and a voltage-stabilization transistor. The drive-compensation circuitry includes a drive transistor and a storage capacitor. An input end of the drive transistor is coupled to a drive-voltage terminal, a control end of the drive transistor is coupled to one end of the storage capacitor, the other end of the storage capacitor and an output end of the drive transistor are coupled in common to a corresponding sub-pixel element. The voltage-stabilization transistor includes a first control end, a second control end, an input end and an output end. The input end of the voltage-stabilization transistor is coupled to a set-voltage terminal. The output end of the voltage-stabilization transistor is coupled to the control end of the drive transistor. The first control end of the voltage-stabilization transistor is coupled to a first gate-control-signal line, and is in cooperation with an active layer of the voltage-stabilization transistor to form a first voltage-stabilization capacitor. The second control end of the voltage-stabilization transistor is coupled to a DC-signal terminal, and is in cooperation with the active layer to form a second voltage-stabilization capacitor.

In an optional embodiment, the pixel drive circuit also includes a data-writing circuitry. An output end of the data-writing circuitry is coupled between the output end of the drive transistor and the input end of the corresponding sub-pixel element. The data-writing circuitry is configured to write a data voltage to the drive transistor in a compensation-and-writing phase.

In an optional embodiment, the data-writing circuitry includes a writing control transistor, a control end of the writing control transistor is coupled to a second gate-control-signal line, an input end of the writing control transistor is coupled to a data-voltage terminal, and an output end of the writing control transistor is coupled to the output end of the drive transistor.

In an optional embodiment, the pixel drive circuit also includes a reset circuitry. The reset circuitry is configured, in response to a reset-response-voltage output from a reset-response-voltage line, to pull down a voltage at one end of the storage capacitor coupled to the sub-pixel element to a reset voltage.

In an optional embodiment, the reset-response-voltage line is the first gate-control-signal line.

In an optional embodiment, the reset circuitry includes a reset control transistor, a control end of the reset control transistor is coupled to the reset-response-voltage line, an input end is coupled to a reference DC voltage end, and an output end is coupled to the driver output of the transistor.

In an optional embodiment, the pixel drive circuit also includes a first light-emitting control transistor and/or a second light-emitting control transistor.

A control end of the first light-emitting control transistor is coupled to a first light-emitting control signal line, an input end of the first light-emitting control transistor is coupled to the drive-voltage terminal, and an output end of the first light-emitting control transistor is coupled to the input end of the drive transistor. A control end of the second light-emitting control transistor is coupled to a second light-emitting control signal line, an input end of the second light-emitting control transistor is coupled to the output end of the drive transistor, and an output end of the second light-emitting control transistor is coupled to the sub-pixel element.

In an optional embodiment, the set-voltage terminal is the drive-voltage terminal, or the DC-signal terminal in the display panel.

In accordance with a second aspect of the embodiments of the present application, a display panel is provided, which includes the pixel drive circuit as above-described.

In accordance with a third aspect of the embodiments of the present application, a display device is provided, which includes the display panel as above-described.

It can be known from the above solutions that, in the pixel drive circuit, the display panel and the display device provided by the present application, a voltage-stabilization transistor is arranged, the voltage-stabilization transistor is provided with two control ends, and each of the two control ends forms a voltage-stabilization capacitor with the active layer, thereby a new capacitor is added on the basis of the original parasitic capacitor. The new capacitor has a relatively large capacitance value. The potential variation at the control end of the drive transistor depends on the parasitic capacitor of the drive transistor, the storage capacitor at the control end of the drive transistor, and the capacitance value of the new capacitor, when the capacitive coupling effect occurs, the voltage at the control end of the drive transistor can be jointly maintained by the above three capacitors, thereby improving the effect of voltage stabilization. The two voltage-stabilization capacitors can serve as a compensation to the storage capacitor, to prolong the time for potential maintenance, which can effectively offset the influence of the capacitive coupling effect, and ensure the effect of pixel display.

BRIEF DESCRIPTION OF THE DRAWINGS

In order to illustrate the embodiments of the present application more clearly, the following will briefly introduce the drawings that need to be used for describing the embodiments or exemplary technologies. Obviously, the drawings in the following description are merely some embodiments of the present application, and for those of ordinarily skills in the art, other drawings can also be obtained according to these drawings without any creative effort.

DETAILED DESCRIPTION OF THE EMBODIMENTS

Figure 1:
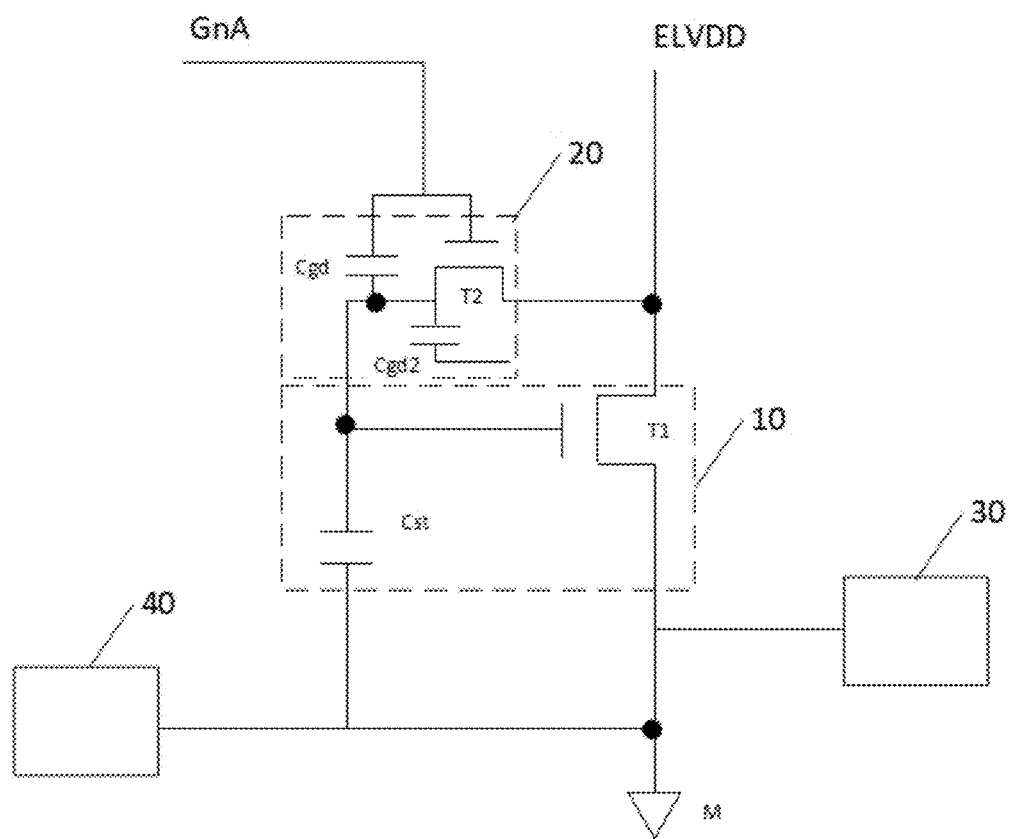
FIG. 1 is a schematic structural diagram of a pixel drive circuit in accordance with an embodiment of the present application.

In order to make the objectives, solutions and beneficial effects of the present application more comprehensible, the present application will be further described in detail below with reference to the drawings and embodiments. It should be understood that the specific embodiments described herein are only used to explain the present application, but not to limit the present application.

In addition, the terms "first" and "second" are only used for descriptive purposes, and should not be construed as indicating or implying relative importance or implying the number of the feature indicated. Thus, a feature defined as "first" or "second" may expressly or implicitly include one or more of that feature. In the description of the present application, the phrase "a/the plurality of" means two or more, unless otherwise expressly and specifically defined. It should be noted that the pixel drive circuit, display panel and display device disclosed in the present application may be used in the field of display technology, and may also be used in any field other than the field of display technology. The application field of the pixel drive circuit, display panel and display device disclosed in the present application will not be limited here.

In a pixel-compensation circuitry, a drive transistor and a writing control transistor are usually included. The writing control transistor is switched off, after a compensation to the threshold voltage of the drive transistor is finished, to cut off the connection path between the drive transistor and other circuitries to ensure the maintenance of the potential. The pixel-compensation circuitry has a capacitive coupling effect when a writing control transistor is switched off. Even if a potential jump occurs at the control end of the drive transistor, the magnitude of the potential jump depends on the parasitic capacitor of the writing control transistor and the storage capacitor at the control end of the drive transistor. Due to the demand for pixel functionality, the capacitive coupling effect in this circuit structure is unavoidable, and also due to the non-uniformity of the manufacturing process, the coupling effect of different pixels are different, resulting in a difference in the potential at the control end of the drive transistor after the capacitive coupling is completed, which eventually leads to the difference in brightness of pixel light emission.

The currently-used TFT is a 3-terminal device, and parasitic capacitors Cgd and Cgs are existed between the gate and the source-drain. As mentioned above, due to the influence of the capacitive coupling effect, when the TFT is switched off, a potential variation at the gate will affect a potential at the drain through the parasitic capacitor Cgd, which, for the compensation circuit, will affect the final compensation effect, and then affect the gray scale displayed by the pixel circuit.

It can be known that the exemplary technology cannot solve the current problem of capacitive coupling effect, and also has no method for sharing data lines for OLEDs when grayscale control is required. In view of this, the embodiments of the present application provide a pixel drive circuit, a display panel and a display device. An invention concept of the present application is to add a new capacitor on the basis of an original parasitic capacitor by arranging a voltage-stabilization transistor having two control ends, each of the two control ends forms a voltage-stabilization capacitor with the active layer, and the newly-formed capacitor has a larger capacitance value. The potential variation at the control end of the drive transistor depends on the parasitic capacitor of the drive transistor, the storage capacitor at the control end of the drive transistor, and the capacitance value of the newly-formed capacitor, when the capacitive coupling effect occurs, the above three capacitors can jointly maintain the voltage at the control end of the drive transistor, thereby improving the effect of voltage stabilization. The two voltage-stabilization capacitors can serve as a compensation to the storage capacitor to prolong the time for potential maintenance, which can effectively offset the influence of the capacitive coupling effect, and ensure the effect of pixel display. Embodiments of the present application will be described in detail below with reference to the drawings.

Figure 2:
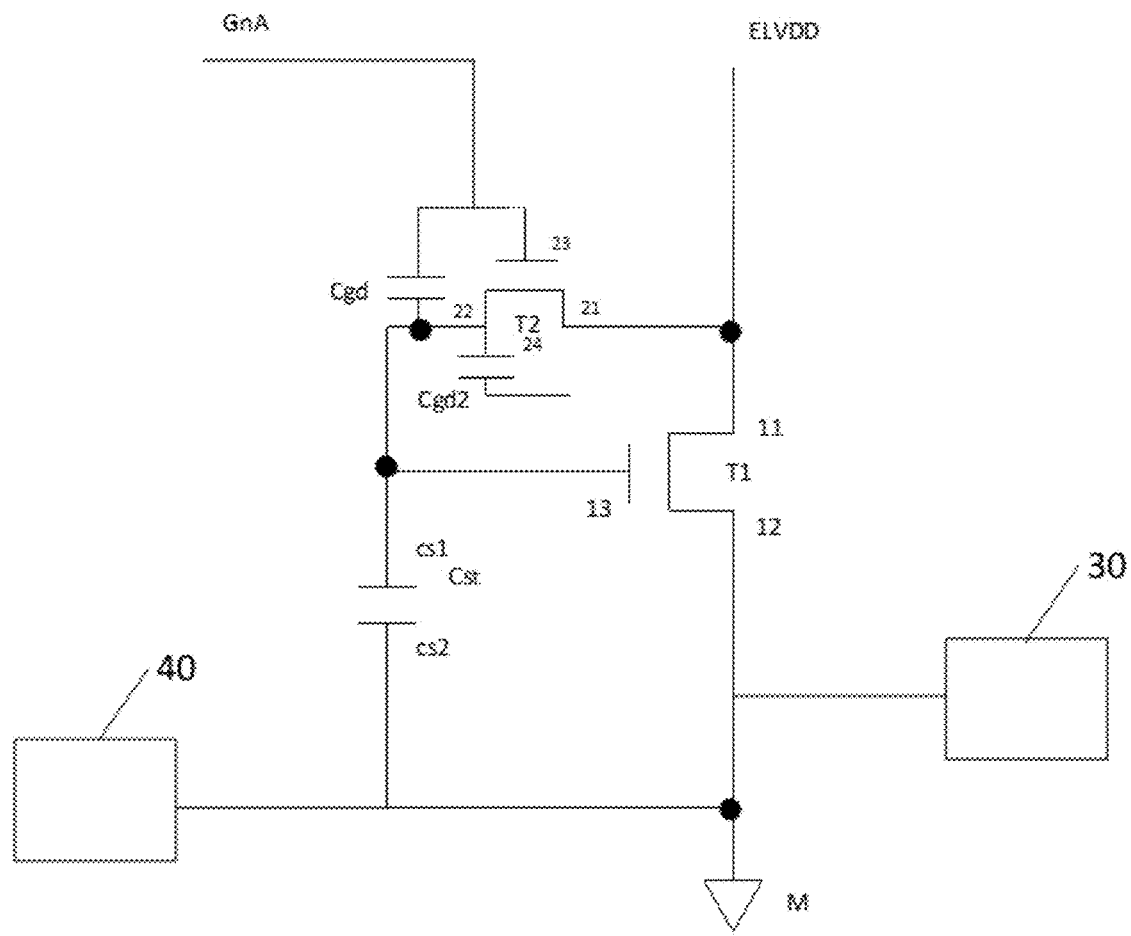
FIG. 2 is a schematic diagram of an end marking of devices in a pixel drive circuit in accordance with an embodiment of the present application.

FIG. 1 shows a pixel drive circuit provided by an embodiment of the present application, and FIG. 2 shows the end connections of each element in FIG. 1. It can be known that the pixel drive circuit of the present application may be applied to a display panel, and the display panel includes a plurality of pixels, each pixel includes a plurality of sub-pixel elements M, and a plurality of pixel drive circuits of the present application are coupled to the plurality of sub-pixel elements M, respectively. As shown in FIG. 1, the pixel drive circuit includes a drive-compensation circuitry 10 and a voltage-stabilization transistor T2 (constituting a voltage-stabilization circuitry 20). The drive-compensation circuitry 10 includes a drive transistor T1 and a storage capacitor Cst. As shown in FIG. 2, an input end 11 of the drive transistor T1 is coupled to the drive-voltage terminal ELVDD, a control end 13 of the drive transistor T1 is coupled to one end cs1 of the storage capacitor Cst, an output end 12 of the drive transistor T1 and the other end cs2 of the storage capacitor are coupled in common to a corresponding sub-pixel element M. The voltage-stabilization transistor T2 includes a first control end 23, a second control end 24, an input end 21, and an output end 22. The input end 21 of the voltage-stabilization transistor T2 is coupled to a set-voltage terminal (i.e., the multiplexed drive-voltage terminal ELVDD in FIG. 2). The output end 22 of the voltage-stabilization transistor T2 is coupled to the control end 13 of the drive transistor T1. The first control end 23 of the voltage-stabilization transistor T2 is coupled to a first gate-control-signal line GnA, and in corporation with an active layer of the voltage-stabilization transistor to form a first voltage-stabilization capacitor Cgd. The second control end 24 of the voltage-stabilization transistor T2 is coupled to a DC-signal terminal, thereby enabling the second control end 24 to cooperate with the active layer to form a second voltage-stabilization capacitor Cgd2.

In the present application, a voltage-stabilization transistor is arranged, the voltage-stabilization transistor is provided with two control ends, and each of the two control ends forms a voltage-stabilization capacitor with the active layer, thereby a new capacitor is added on the basis of the original parasitic capacitor. The newly-formed capacitor has a relatively large capacitance value. The potential variation at the control end of the drive transistor depends on the parasitic capacitor of the drive transistor, the storage capacitor at the control end of the drive transistor, and the capacitance value of the new capacitor, when the capacitive coupling effect occurs, the voltage at the control end of the drive transistor can be jointly maintained by the above three capacitors, thereby improving the effect of voltage stabilization. The two voltage-stabilization capacitors can serve as a compensation to the storage capacitor to prolong the time for potential maintenance, which can effectively offset the influence of the capacitive coupling effect, and ensure the effect of pixel display.

It can be understood that, in an embodiment of the present application, as shown FIG. 1 and FIG. 2, the multiplexed drive-voltage terminal ELVDD is the set-voltage terminal. In other optional embodiments, the set-voltage terminal may be any terminal of high-level voltage in the display panel, as long as the voltage at the high-level voltage terminal is higher than the threshold voltage at the gate control of the voltage-stabilization transistor (for example, for a general transistor, when the voltage is higher than 0.7V, the transistor can be switched on, that is, it is only needed that the voltage at the high-level voltage terminal is higher than 0.7V), which will not be limited in here.

Figure 3:
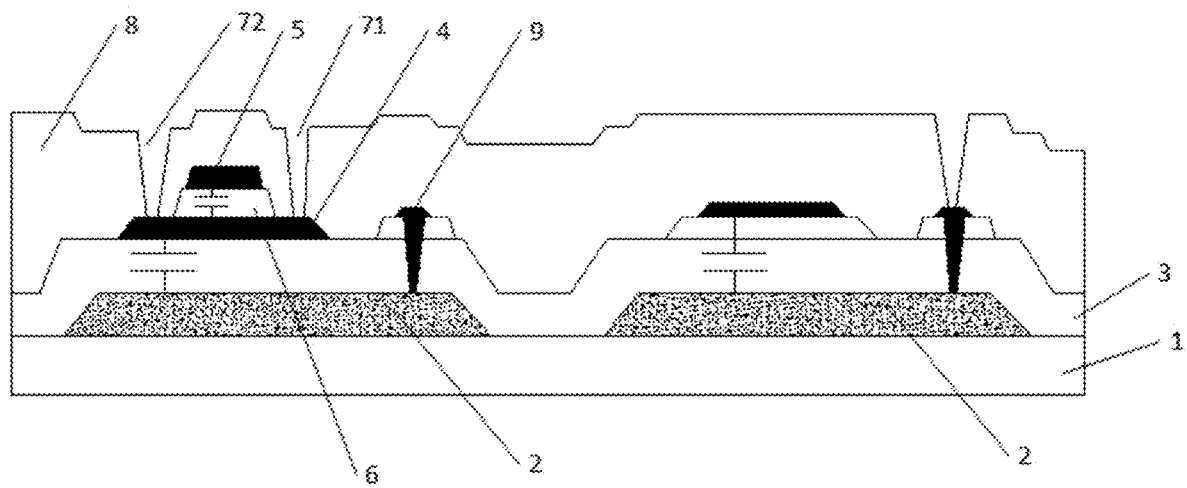
FIG. 3 is a schematic diagram of a layer structure of a thin film transistor in accordance with an embodiment of the present application.

The specific structure of the voltage-stabilization transistor of the present application will be described in detail below. FIG. 3 shows a schematic structural diagram of a voltage-stabilization transistor provided by an embodiment of the present application, and FIG. 2 shows a schematic structural diagram of the pixel drive circuit including the thin film transistor shown in FIG. 1. The thin film transistor in FIG. 1 is the voltage-stabilization transistor T2 of the pixel drive circuit in FIG. 2. As shown in FIG. 3, The thin film transistor (i.e., the voltage-stabilization transistor) includes: a substrate 1; a first metal layer 2 formed on one side surface of the substrate 1; an active layer 4 formed on a side of the first metal layer 2 away from the substrate 1; and a switch structure located on a side of the active layer 4 away from the first metal layer 2. The switch structure includes a gate constituted by a second metal layer 5, and a source (formed by depositing metal from a via hole 72 in FIG. 3) and a drain (formed by depositing metal from a via hole 71 in FIG. 3). The first metal layer 2 is coupled to a DC-voltage terminal.

In an embodiment of the present application, the substrate, also known as a supporting base, is a clean single crystal sheet having a specific crystal plane and appropriate electrical, optical and mechanical properties for growing an epitaxial layer, which will not be further described in the present application. The present application is related to the field of display, so the substrate is generally a glass substrate. The glass substrate has a mechanical support function, and various layer structures can be formed on the substrate by means of deposition and the like.

In an embodiment of the present application, the first metal layer 2 is formed on one side surface of the substrate 1, and the first metal layer 2 constitutes a bottom gate of the thin film transistor in the embodiment of the present application. The conductive metal 9 is electrically connected to an external DC wire, for example, an end of the DC wire is soldered to the conductive metal in the via hole.

The active layer is formed on the side of the first metal layer 2 away from the substrate 1, that is, the active layer is located above the first metal layer 2. During specific fabrication, a buffer layer 3 may be arranged between the active layer 4 and the first metal layer 2, which, on the one hand, plays the role of electrical isolation, and on the other hand provides certain mechanical support and buffering.

The second metal layer 5 is formed above the active layer 4, the second metal layer 5 constitutes a top gate of the thin film transistor, and a gate-insulation film (GI) layer 6 may be disposed between the second metal layer 5 and the active layer 4.

In addition, an interlayer dielectric 8 is deposited on the active layer 4, and then the interlayer dielectric 8 is exposed and masked, a pair of via holes 71 and 72 may be formed on the active layer, and then metal is deposited on the via holes 71 and 72 to form a source and a drain located on both sides of the second metal layer 5 and in electrical contact with the active layer 4, whereby the switch structure of the present application is formed, and specifically, in the switch structure, the metal deposited in the pair of via holes serve as the source and the drain, respectively, and the second metal layer serves as the gate.

In this embodiment, the thin film transistor is configured having the layer structure as above-described, since the first metal layer is coupled to the DC-voltage terminal, the voltage of the first metal layer is stabilized to the voltage of the DC voltage terminal, thereby one capacitor Cgd2 is formed between the first metal layer and the active layer, and another capacitor Cgd is formed between the second metal layer and the active layer. It can be understood that since the capacitance is proportional to the plate area of the capacitor, the first metal layer serving as the bottom gate may have a unlimited size (there is no interference from other devices or layer structures at the bottom-gate), so in the extreme, the first metal layer as the bottom gate may cover the entire substrate, It should be noted that, in practical use, the area of the first metal layer is generally controlled to be smaller than the entire substrate area.

Further, in an exemplary embodiment of the present application, the first metal layer 2 and the second metal layer 5 are extended to form two surfaces that are close to each other and are exposed to each other, such that a capacitance Cst can be formed between the first metal layer and the second metal layer.

In the present application, the first metal layer and the first metal layer are configured to be coupled to the DC voltage terminal, compared with the 3-terminal TFT of the exemplary technology, a new capacitor Cgd2 is added, and the plate area of the capacitor Cgd2 can be configured in a relatively unrestricted environment, which on the one hand, enables the capacitance Cgd2 to be made larger, and on the other hand, enables the capacitance value of capacitor Cgd2 to be flexibly adjusted, thereby the TFT is made into a 4-terminal device in the present application, and a layer of metal on an opposite side of the insulation layer at the bottom of the device serves as the bottom gate of the device. The bottom gate is connected to a DC signal in the circuit. Capacitors Cgd2, Cgs2 will be formed between the bottom gate and the source and drain of the device, respectively. Because an area of the bottom gate usually covers other electrodes of the entire device, the newly-formed capacitors Cgd2, Cgs2 have larger capacitance values, when the capacitive coupling effect occurs, the potential variation at the control end of the drive transistor depends on the parasitic capacitor of the writing control transistor and the storage capacitor of the control end of the drive transistor as well as the capacitance of the newly-formed capacitor Cgd2, so the capacitors Cgd2, Cgs2 can serve as a fixed voltage-stabilization capacitor to effectively offset the capacitive feedthrough effect of capacitors Cgd, Cgs, and further ensure the effect of pixel display.

With reference to FIG. 1 and FIG. 2, the drive transistor T1 the voltage-stabilization transistor T2 are shown. An input end of the drive transistor T1 is coupled to the drive-voltage terminal ELVDD, and an output end of the drive transistor T1 is coupled to the pixel drive circuit to be compensated. The voltage-stabilization transistor T2 is the thin film transistor as above-described, the second metal layer of the voltage-stabilization transistor T2 is coupled to the first gate-control-signal line GnA, the first metal layer of the voltage-stabilization transistor T2 is coupled to the DC signal line, the source of the voltage-stabilization transistor T2 is coupled to the input end of the drive transistor T1, and the drain of the voltage-stabilization transistor T2 is coupled to the control end of the drive transistor T1. In this way, when the drive transistor T1 is in use, the voltage at the control end of the drive transistor T1 gradually attenuates as time goes on. Meanwhile, the voltage-stabilization transistor T2 is switched on during the reset and compensation phases, the drive voltage on the ELVDD line to input to the voltage-stabilization transistor T2 to "charge" the capacitors Cgd, Cgd2, and then when T2 is switched off, the capacitors Cgd, Cgd2 will perform a compensation to the voltage at the control end of T1 if the voltage at the control end of T1 is attenuated. At the same time, the voltage at the control end of T1 is also compensated by the capacitor Cst. That is, in the embodiment of the present application, the voltage at the control end of T1 can be compensated by the capacitors Cst, Cgd and Cgd2 if the voltage at the control end of T1 is attenuated, thus, the voltage attenuation at the control end of T1 is more difficult, meanwhile, the capacitors Cgd2, Cgs2 can serve as a fixed voltage-stabilization capacitor to effectively offset the feedthrough effect of the capacitors Cgd, Cgs, which further ensures the effect of pixel display.

In the specific embodiment of the present application, still referring to FIG. 1, the pixel drive circuit of the present application also includes a data-writing circuitry 30. An output end of the data-writing circuitry 30 is coupled between the output end 12 of the drive transistor T1 and the input end of the corresponding sub-pixel element M. The data-writing circuitry 30 is configured to write the data voltage to the drive transistor in a compensation-and-writing phase.

Figure 4:
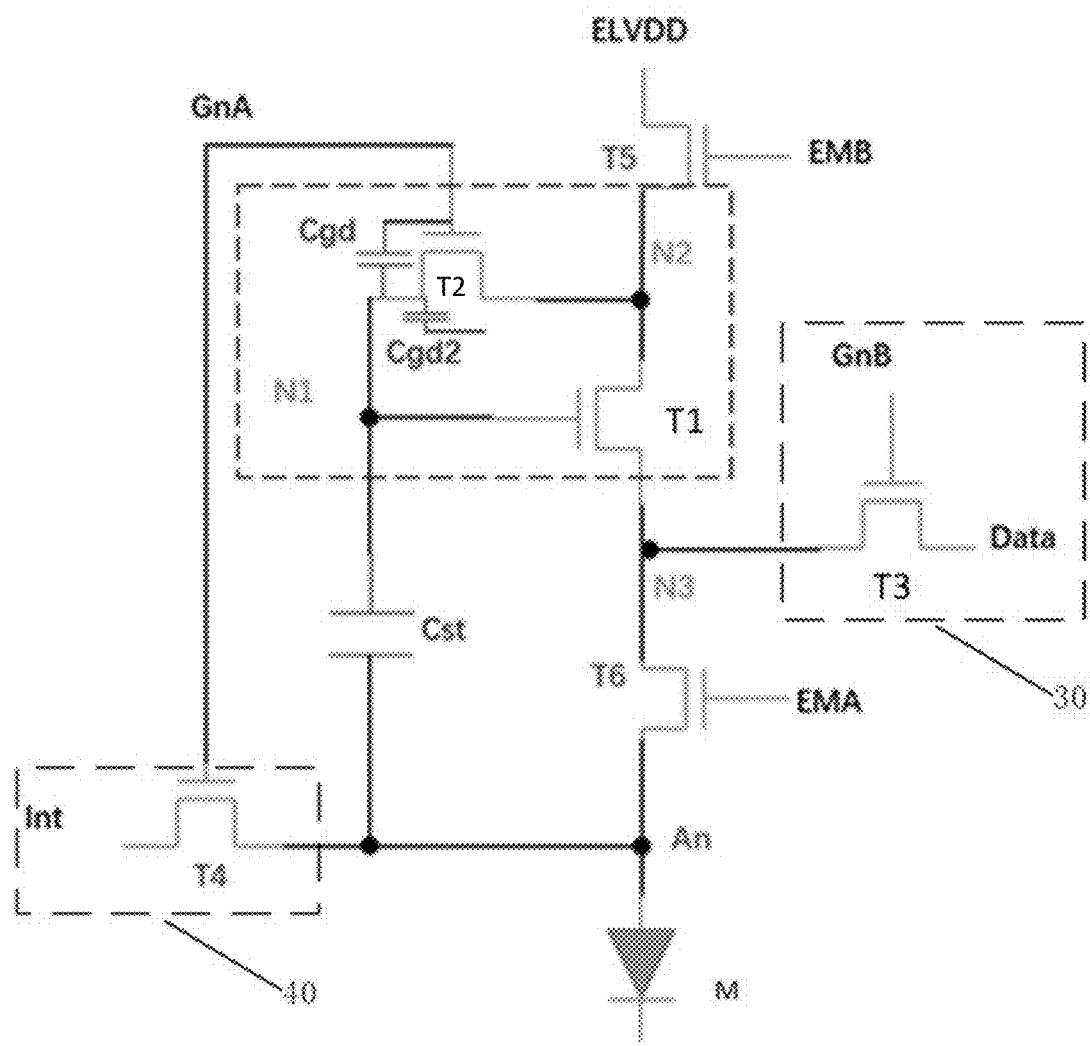
FIG. 4 is a schematic diagram of a detailed structure of a pixel drive circuit in accordance with an embodiment of the present application.

A schematic diagram of a specific structure of a data-writing circuitry is provided below. As shown in FIG. 4, the data-writing circuitry 30 in this embodiment of the present application includes a writing control transistor T3. A control end of the writing control transistor T3 is coupled to a second gate-control-signal line GnB, an input end of the writing control transistor T3 is coupled to a data-voltage terminal DATA, and an output end of the writing control transistor T3 is coupled to the output end of the drive transistor T1. Specifically, in a data-writing phase, the control end 13 of the drive transistor T1 discharges to the Vdata, and stops until the voltage is arrived at Vdata+a threshold voltage Vth (for example, 0.7V) of the drive transistor T1, that is, the signal Vdata has been written with respect to the drive transistor T1.

In addition, also referring to FIG. 1 and FIG. 2, in a preferred embodiment, the pixel drive circuit of the present application also includes a reset circuitry 40. The reset circuitry is configured, in response to a reset-response voltage output from a reset-response-voltage line, to pull down a voltage at one end of the storage capacitor coupled to the sub-pixel element to a reset voltage.

Exemplarily, the reset-response-voltage line is the first gate-control-signal line, of course, it should be understood that the reset-response-voltage line may also be other high-level voltage lines, as long as the timing sequence meets the requirements, that is, as long as the line has a high-level voltage during the reset phase and the compensation phase.

Exemplarily, the reset circuitry 40 of the present application specifically includes: a reset control transistor T4. A control end of the reset control transistor T4 is coupled to the first gate-control-signal line GnA, an input end of the reset control transistor T4 is coupled to a reference DC-voltage terminal Int, and output end of the reset control transistor T4 is coupled to the output end 11 of the drive transistor T1.

In a further exemplary embodiment, the pixel drive circuit of the present application also include a first light-emitting control transistor T5. A control end of the first light-emitting control transistor T5 is coupled to a first light-emitting control signal line EMB, an input end of the first light-emitting control transistor T5 is coupled to the drive-voltage terminal ELVDD, and an output end of the first light-emitting control transistor T5 is coupled to the input end 11 of the drive transistor T1.

In addition, the pixel drive circuit provided by an embodiment of the present application also includes a second light-emitting control transistor T6. A control end of the second light-emitting control transistor T6 is coupled to a second light-emitting control signal line EMA, an input end of the second light-emitting control transistor T6 is coupled to the output end 12 of the drive transistor T1, and an output end of the second light-emitting control transistor T6 is coupled to the sub-pixel element M.

In the present application, the first light-emitting control transistor T5 and the second light-emitting control transistor T6 are configured to switch a timing control phase, so that the device structure can form a circuit control method having the reset, compensation, writing and light-emitting phases, as detailed in the following description.

Figure 5:
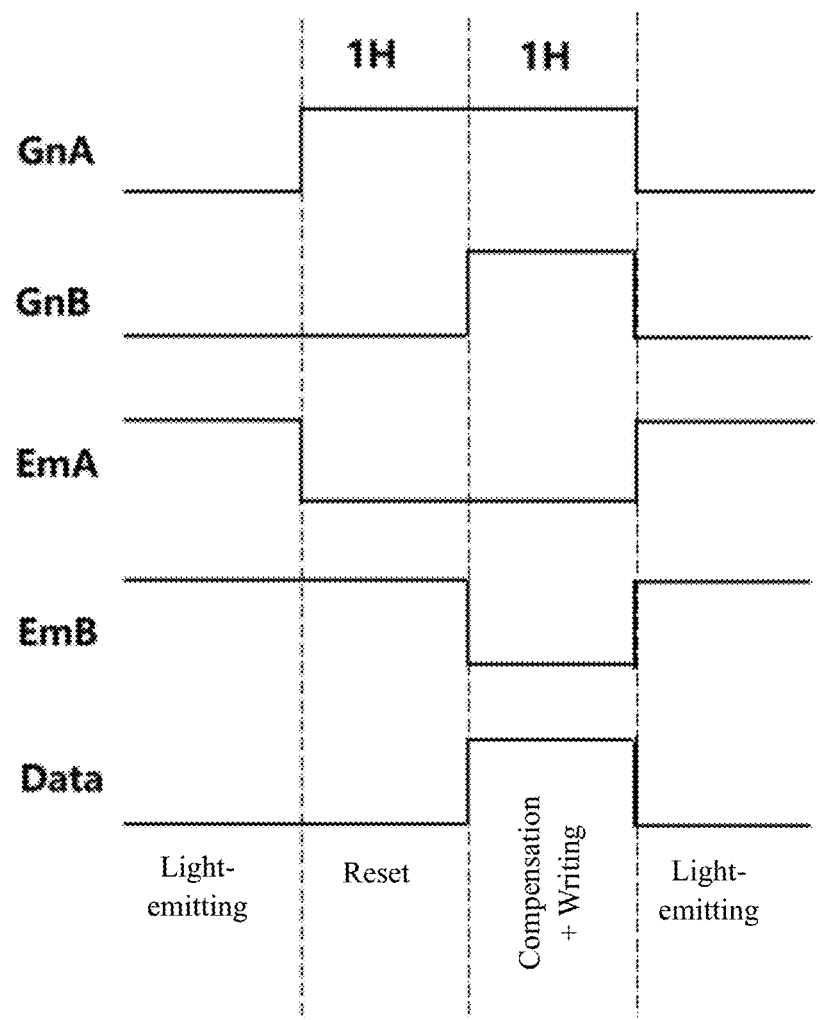
FIG. 5 is a sequential control diagram of a pixel drive circuit in accordance with an embodiment of the present application.

In the present application, with reference to the sequential diagram shown in FIG. 5, the compensation process/driving process of the present application is illustrated in detail with reference to the sequential diagram.

In specific use, a compensation operation performed by the pixel compensation circuitry usually has four phases, i.e., a reset phase, a compensation phase, a writing phase, and a light-emitting phase.

First, in the reset phase, the potential of the control line EMA is jumped to a low level, so that the transistor T6 is switched off, and the light-emitting path is cut off. The transistors T5, T2 and T4 are switched on through the control line EMB and the scan line GnA, to charge the first and second ends of the storage capacitor Cst to an initial potential VDD and a reference DC voltage;

In this circuit, the compensation and writing are one phase. In the compensation-and-writing phase, the transistor T1 is switched on through the scan line GnB, the source of the transistor T1 is connected to the data signal line, and the data signal and the threshold voltage of the transistor T1 are stored at the gate of transistor T1 by the transistor T2 in a self-discharge manner.

In the light-emitting phase, the potentials of the scan lines GnA and GnB are jumped to a low level, the transistors T2, T3 and T4 will be switched off, and the transistors T5, T1, T6 and OLED form a conductive path, which can eliminate the influence of the threshold voltage of the transistor on the gray scale of the pixel.

In an embodiment of the present application, the sub-pixel element M is an organic self-luminous thin film device, and each sub-pixel element M may be one of a red sub-pixel, a green sub-pixel and a blue sub-pixel. In an exemplary embodiment, the three sub-pixel elements M are combined to form a complete pixel, color adjustment can be performed by adjusting a driving voltage of each sub-pixel element M in the pixel.

It can be understood that, in the present application, a pixel is the smallest integrated unit that constitutes a pixel arrangement, and the pixel arrangement constitutes an entire display panel (i.e., the to-be-compensated panel in the present application), that is, the pixel arrangement includes a plurality of pixels arranged in a specific arrangement. Each pixel is electrically connected to a driver IC (integrated circuit) through an independent drive line, and the sub-pixels in the pixel are powered on by a driving of the driver IC to emit color light.

It can be known that, as mentioned above, one pixel generally includes a blue sub-pixel, a red sub-pixel and a green sub-pixel. In an optional embodiment, the pixel may also include a sub-pixel having one other color, the other color may be different from red, blue, and green, such as the other color may include white, yellow, or cyan. It should be noted that, if the other color is white, the display brightness of the display device where the pixel arrangement structure is located can be improved. If the other color is other colors instead of white, the color gamut of the display device can be increased, which will not be further described in here.

In an embodiment of the present application, the pixel drive circuit is applied to an OLED display, and correspondingly, the drive transistor and the thin film transistor serving as the voltage-stabilization transistor, in a preferred embodiment, may be low temperature poly-silicon (LTPS) thin film transistors or other oxide thin film transistors, which is not limited in the present application.

Furthermore, the switch elements of the present application, such as the drive transistor T1, are all thin film transistors. In specific implementation, the thin film transistors may be indium gallium zinc oxide (IGZO) thin film transistors, etc., which is not limited in the present application.

In addition, it should be noted that the wording "coupled to" in the embodiments of the present application may refer to a direct electrical connection or an indirect electrical connection. For example, when it is mentioned that A is coupled to B, which may be that A and B are directly and electrically connected through wires or through wireless signal-transmission-channels, which may also be that A and B are electrically connected through C, such as, A and B are both directly connected to C through wires, or A transmits a signal to C and C transmits the signal to B, then an indirect electrical connection is formed between A and B.

In accordance with an embodiment of the present application, a display panel is also provided, which includes a plurality of pixels, each pixel includes a plurality of sub-pixel elements. The display panel also includes the pixel drive circuit as above-described, and each pixel drive circuit is coupled to a sub-pixel element, and configured to control a voltage on the sub-pixel element to adjust the brightness.

In general, the pixels are arranged in an array arrangement. It should be understood that the arrangement of the pixels can also be determined based on actual requirements, which will not be limited in here.

Figure 6:
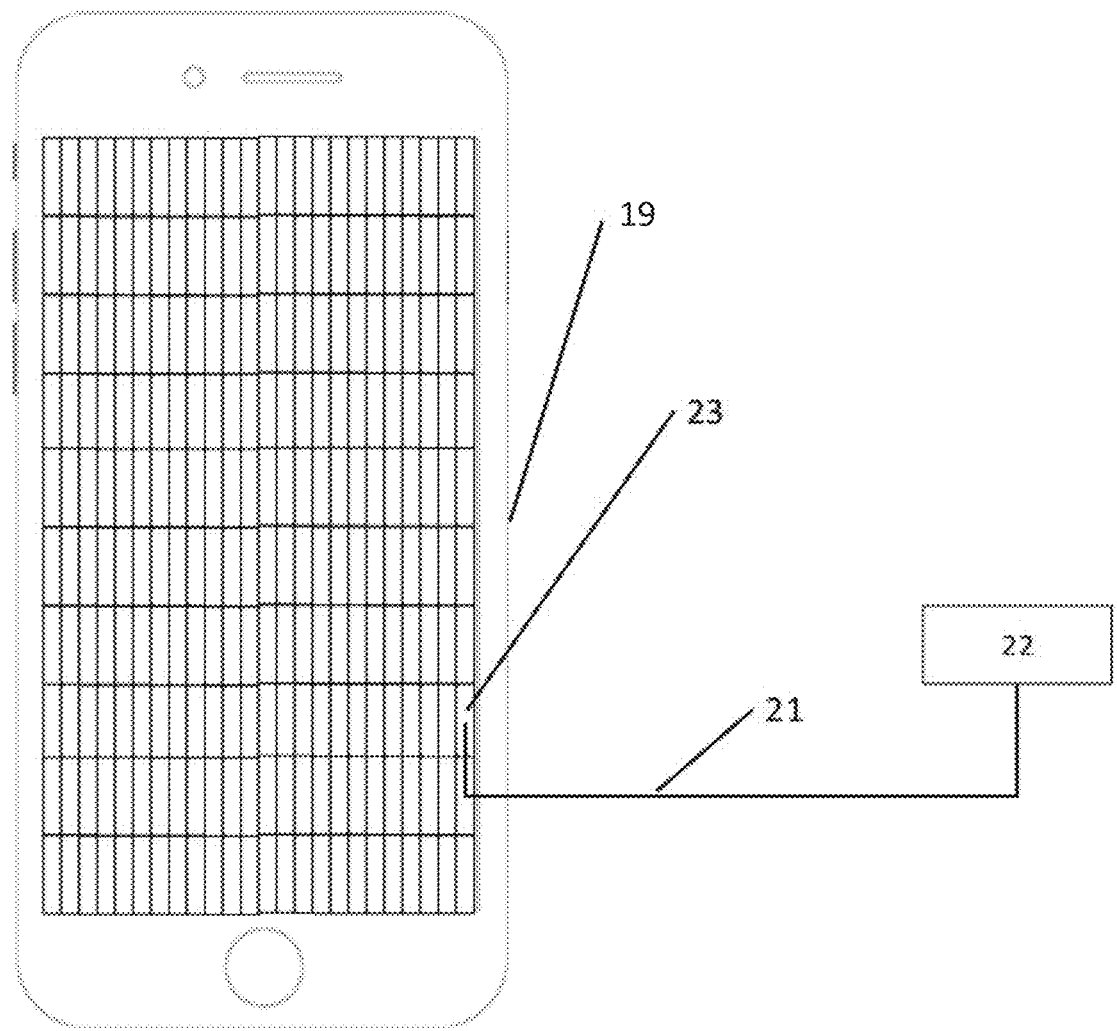
FIG. 6 is a schematic structural diagram of a display device in accordance with an embodiment of the present application.

As shown in FIG. 6, a display device 19 is provided in accordance with an embodiment of the present application, which may include the pixel drive circuit and the display panel as above-described. The display panel includes a plurality of pixels, and each pixel includes a plurality of sub-pixel elements 23. The pixel drive circuit 22 is coupled to the control end of the switch element T6 (shown in FIG. 4) corresponding to a sub-pixel element 23 of the display device through a wire 21.

In a specific implementation, the display device provided by an embodiment of the present application may be any product or component having a display function, such as a mobile phone, a tablet computer, a television, a monitor, a notebook computer, a digital photo frame, and a navigator.

It should be noted that, the embodiments of the display device, the embodiment of the test method, and the embodiment of the pixel drive circuit provided in the embodiments of the present application may all refer to each other, which will not be limited to the embodiments of the present application. Steps of the method for testing the display panel provided by the embodiments of the present application may be correspondingly increased or decreased according to actual situations. Variations of these methods, that can be easily conceived by those skilled artists who are familiar with the field disclosed in the present application, should all be covered within the protection scope of the present application, which will not be repeated here.

The above descriptions are merely optional embodiments of the present application, and are not intended to limit the present application. Any modifications, equivalent replacements, improvements, etc. made within the fundamental and principles of the present application shall be included within the protection scope of the present application.

What is claimed is:

1. A pixel drive circuit, applied to a display panel, the display panel comprising a plurality of pixels, each pixel comprising a plurality of sub-pixel elements, and the pixel drive circuit comprising:
   a drive-compensation circuitry, comprising:
   a drive transistor, an input end of the drive transistor being coupled to a drive-voltage terminal; and
   a storage capacitor, one end of the storage capacitor being coupled to a control end of the drive transistor, another end of the storage capacitor and an output end of the drive transistor being coupled in common to a corresponding sub-pixel element of the plurality of pixels; and
   a voltage-stabilization transistor, comprising: an input end, an output end, a first control end and a second control end, wherein the input end of the voltage-stabilization transistor is coupled to a set-voltage terminal, the output end of the voltage-stabilization transistor is coupled to the control end the drive transistor, the first control end of the voltage-stabilization transistor is coupled to a first gate-control-signal line, and is in cooperation with an active layer of the voltage-stabilization transistor to form a first voltage-stabilization capacitor, and the second control end of the voltage-stabilization transistor is coupled to a direct current (DC) signal terminal, and is in cooperation with the active layer of the voltage-stabilization transistor to form a second voltage-stabilization capacitor, wherein the second control end of the voltage-stabilization transistor covers an entire substrate of the voltage-stabilization transistor,
   wherein the pixel drive circuit further comprises a reset circuitry, the reset circuitry is configured, in response to a reset-response-voltage output from a reset-response-voltage line, to pull down a voltage at one end of the storage capacitor coupled to the sub-pixel element to a reset voltage, and wherein the reset-response-voltage line is the first gate-control-signal line.

2. The pixel drive circuit according to claim 1, further comprising:
   a data-writing circuitry, wherein an output end of the data-writing circuitry is coupled between the output end of the drive transistor and an input end of the corresponding sub-pixel element, and wherein the data-writing circuitry is configured to write a data voltage to the drive transistor in a compensation-and-writing phase.

3. The pixel drive circuit according to claim 2, wherein the data-writing circuitry comprises a writing control transistor, a control end of the writing control transistor is coupled to a second gate-control-signal line, an input end of the writing control transistor is coupled to a data-voltage terminal, and an output end of the writing control transistor is coupled to the output end of the drive transistor.

4. The pixel drive circuit according to claim 2, further comprising:
   a first light-emitting control transistor, wherein a control end of the first light-emitting control transistor is coupled to a first light-emitting control signal line, an input end of the first light-emitting control transistor is coupled to the drive-voltage terminal, and an output end of the first light-emitting control transistor is coupled to the input end of the drive transistor; and/or,
   a second light-emitting control transistor, wherein a control end of the second light-emitting control transistor is coupled to a second light-emitting control signal line, an input end of the second light-emitting control transistor is coupled to the output end of the drive transistor, and an output end of the second light-emitting control transistor is coupled to the sub-pixel element.

5. The pixel drive circuit according to claim 1, wherein the reset circuitry comprises a reset control transistor, a control end of the reset control transistor is coupled to the reset-response-voltage line, an input end of the reset control transistor is coupled to a reference DC-voltage terminal, and an output end of the reset control transistor is coupled to the output end of the drive transistor.

6. The pixel drive circuit according to claim 1, wherein the set-voltage terminal is the drive-voltage terminal or the DC signal terminal in the display panel.

7. A display panel, comprising:
   a plurality of pixels, each pixel comprising a plurality of sub-pixel elements; and
   a pixel drive circuit, comprising:
      a drive-compensation circuitry, comprising:
         a drive transistor, an input end of the drive transistor being coupled to a drive-voltage terminal; and
         a storage capacitor, one end of the storage capacitor being coupled to a control end of the drive transistor, another end of the storage capacitor and an output end of the drive transistor being coupled in common to a corresponding sub-pixel element of the plurality of pixels; and
      a voltage-stabilization transistor, comprising: an input end, an output end, a first control end and a second control end, wherein the input end of the voltage-stabilization transistor is coupled to a set-voltage terminal, the output end of the voltage-stabilization transistor is coupled to the control end the drive transistor, the first control end of the voltage-stabilization transistor is coupled to a first gate-control-signal line, and is in cooperation with an active layer of the voltage-stabilization transistor to form a first voltage-stabilization capacitor, and the second control end of the voltage-stabilization transistor is coupled to a DC signal terminal, and is in cooperation with the active layer of the voltage-stabilization transistor to form a second voltage-stabilization capacitor, wherein the second control end of the voltage-stabilization transistor covers an entire substrate of the voltage-stabilization transistor,
      wherein the pixel drive circuit further comprises a reset circuitry, the reset circuitry is configured, in response to a reset-response-voltage output from a reset-response-voltage line, to pull down a voltage at one end of the storage capacitor coupled to the sub-pixel element to a reset voltage, and wherein the reset-response-voltage line is the first gate-control-signal line.

8. The display panel according to claim 7, wherein the pixel drive circuit further comprises a data-writing circuitry, an output end of the data-writing circuitry is coupled between the output end of the drive transistor and an input end of the corresponding sub-pixel element, and wherein the data-writing circuitry is configured to write a data voltage to the drive transistor in a compensation-and-writing phase.

9. The display panel according to claim 8, wherein the data-writing circuitry comprises a writing control transistor, a control end of the writing control transistor is coupled to a second gate-control-signal line, an input end of the writing control transistor is coupled to a data-voltage terminal, and an output end of the writing control transistor is coupled to the output end of the drive transistor.

10. The display panel according to claim 8, wherein the pixel drive circuit further comprises a first light-emitting control transistor, a control end of the first light-emitting control transistor is coupled to a first light-emitting control signal line, an input end of the first light-emitting control transistor is coupled to the drive-voltage terminal, and an output end of the first light-emitting control transistor is coupled to the input end of the drive transistor; and/or, a second light-emitting control transistor, wherein a control end of the second light-emitting control transistor is coupled to a second light-emitting control signal line, an input end of the second light-emitting control transistor is coupled to the output end of the drive transistor, and an output end of the second light-emitting control transistor is coupled to the sub-pixel element.

11. The display panel according to claim 7, wherein the reset circuitry comprises a reset control transistor, a control end of the reset control transistor is coupled to the reset-response-voltage line, an input end of the reset control transistor is coupled to a reference DC-voltage terminal, and an output end of the reset control transistor is coupled to the output end of the drive transistor.

12. The display panel according to claim 7, wherein the set-voltage terminal is the drive-voltage terminal or the DC signal terminal in the display panel.

13. A display device, comprising:
a display panel, comprising:
a plurality of pixels, each pixel comprising a plurality of sub-pixel elements; and
a pixel drive circuit, comprising:
a drive-compensation circuitry, comprising:
a drive transistor, an input end of the drive transistor being coupled to a drive-voltage terminal; and
a storage capacitor, one end of the storage capacitor being coupled to a control end of the drive transistor, another end of the storage capacitor and an output end of the drive transistor being coupled in common to a corresponding sub-pixel element of the plurality of pixels; and
a voltage-stabilization transistor, comprising: an input end, an output end, a first control end and a second control end, wherein the input end of the voltage-stabilization transistor is coupled to a set-voltage terminal, the output end of the voltage-stabilization transistor is coupled to the control end the drive transistor, the first control end of the voltage-stabilization transistor is coupled to a first gate-control-signal line, and is in cooperation with an active layer of the voltage-stabilization transistor to form a first voltage-stabilization capacitor, and the second control end of the voltage-stabilization transistor is coupled to a DC signal terminal, and is in cooperation with the active layer of the voltage-stabilization transistor to form a second voltage-stabilization capacitor, wherein the second control end of the voltage-stabilization transistor covers an entire substrate of the voltage-stabilization transistor,
wherein the pixel drive circuit further comprises a reset circuitry, the reset circuitry is configured, in response to a reset-response-voltage output from a reset-response-voltage line, to pull down a voltage at one end of the storage capacitor coupled to the sub-pixel element to a reset voltage, and wherein the reset-response-voltage line is the first gate-control-signal line.

* * * * *